(12) United States Patent
Kyung et al.

(10) Patent No.: US 6,549,444 B2
(45) Date of Patent: Apr. 15, 2003

(54) MEMORY DEVICE WITH PREFETCHED DATA ORDERING DISTRIBUTED IN PREFETCHED DATA PATH LOGIC, CIRCUIT, AND METHOD OF ORDERING PREFETCHED DATA

(75) Inventors: Kye-Hyun Kyung, Suwon (KR); Chang Sik Yoo, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/834,493

(22) Filed: Apr. 12, 2001

(65) Prior Publication Data

US 2002/0149960 A1 Oct. 17, 2002

(51) Int. Cl.[7] .................................................. G11C 5/06
(52) U.S. Cl. ...................... 365/63; 365/189.02; 711/154
(58) Field of Search ................................. 711/157, 154; 710/305; 365/63, 189.02

(56) References Cited

U.S. PATENT DOCUMENTS

| 5,594,919 A | | 1/1997 | Turkowski | .................. 712/300 |
| 5,802,596 A | * | 9/1998 | Shinozaki | .................. 711/169 |
| 6,115,321 A | * | 9/2000 | Koelling et al. | ............ 365/233 |

* cited by examiner

Primary Examiner—David L. Robertson
(74) Attorney, Agent, or Firm—Marger Johnson & McCollom, P.C.

(57) ABSTRACT

A memory device is adapted for prefetching data. The memory device has a memory cell array, with local sense amplifiers for receiving data bits prefetched from the memory cell array. The memory device also includes a serializer, and data paths that connect the local sense amplifiers to the serializer. Crossover connections are interposed between stages of the data paths. These transfer data bits between the data paths. Preferably they do that as part of being gates between the stages, which are in turn controlled by a clock. This way ordering is distributed within the data paths, and thus does not limit how fast the clock may become. In addition, the space used remains at a fundamental minimum.

25 Claims, 13 Drawing Sheets

FIG. 12

| BURST ORDER | | | TYPE OF ORDERING | |
|---|---|---|---|---|
| A2 | A1 | A0 | SEQUENTIAL | INTERLEAVE |
| 0 | 0 | 0 | 0-1-2-3-4-5-6-7 | 0-1-2-3-4-5-6-7 |
| 0 | 0 | 1 | 1-2-3-4-5-6-7-0 | 1-0-3-2-5-4-7-6 |
| 0 | 1 | 0 | 2-3-4-5-6-7-0-1 | 2-3-0-1-6-7-4-5 |
| 0 | 1 | 1 | 3-4-5-6-7-0-1-2 | 3-2-1-0-7-6-5-4 |
| 1 | 0 | 0 | 4-5-6-7-0-1-2-3 | 4-5-6-7-0-1-2-3 |
| 1 | 0 | 1 | 5-6-7-0-1-2-3-4 | 5-4-7-6-1-0-3-2 |
| 1 | 1 | 0 | 6-7-0-1-2-3-4-5 | 6-7-4-5-2-3-0-1 |
| 1 | 1 | 1 | 7-0-1-2-3-4-5-6 | 7-6-5-4-3-2-1-0 |

MEMORY DEVICE WITH PREFETCHED DATA ORDERING DISTRIBUTED IN PREFETCHED DATA PATH LOGIC, CIRCUIT, AND METHOD OF ORDERING PREFETCHED DATA

BACKGROUND OF THE INVENTION

1. Field of the Invention

The present invention is related to the field of semiconductor memory devices, and more specifically to a memory device with prefetched data ordering that is distributed in prefetched data path logic, and a method of ordering prefetched data.

2. Description of the Related Art

Memory devices are used in electronic devices for storing data. As there is continuing competitive pressure to make electronic devices faster, the memory device is often found to be a limitation in the speed of the overall device. Indeed, sometimes the memory device requires its own, internal clock for its operation, which is slower than the external clock of the overall device. And as there is continuing competitive pressure for devices of larger capacity, there is pressure to make memories larger, which further restricts how fast they can become.

An example of a memory device 100 in the prior art is shown in FIG. 1. While salient parts are explained in this description, more details can be found in a number of references, such as U.S. Pat. No. 6,115,321.

Memory device 100 includes a memory cell array (MCA) 102. Array 102 has cells, such as cell 104. One data bit is stored at each cell 104. The cells are arranged at intersections of rows, such as wordline 106, and columns 108. Columns 108 are also called local input/output (I/O) lines 108.

A number of local I/O lines 108 terminate in a single local sense amplifier LS/A 110A. A number of such local sense amplifiers are provided, similar to LS/A 110A. Out of each local sense amplifier there emerges a Global I/O (GIO) line. Eight such GIO lines 114A–114H are shown as a group.

Reading data from memory device 100 entails outputting the bit stored in cell 104 to one of GIO lines 114, and from there to a DQ pad 120. All DQ pads 120 feed their data to a cache memory 122, or other kinds of electronic devices requiring data storage.

In memory devices such as device 100, the problem of speed has been addressed in the prior art by prefetching data that is to be read. That means reading many data simultaneously out of the memory device 100 for a single DQ pad, in response to a single address input. This is a core DRAM operation.

With prefetching, as the data is output from GIO lines 114, it needs to be ordered, before it is output to DQ pads. If not, then the electronic device reading data from the memory device may have to wait too long before it receives the necessary data.

Ordering of the data is accomplished in device 100 by having all GIO lines 114A–114H from array 110 come together in a data sequencing block 118, before reaching DQ pad 120. Block 118 receives eight inputs, one from each data path, and outputs the same eight inputs in the desired order, subject to ordering signals.

The ordered data is then serialized, by a serializing block 119. Block 119 receives all the inputs, and outputs them one by one to DQ pad 120.

Referring now to FIG. 2, a portion 118-1 of data sequencing block 118 is shown. It will be appreciated that only 4 inputs and 4 outputs are shown in portion 118-1. Since it has eight inputs, actual block 118 is commensurately larger.

Block 118 occupies space that is desirable to allocate elsewhere in the memory device. In addition, as external data rates increase, the number of prefetched data words is increased, and thus block 118 must become commensurately larger. For example, to handle twice the number of inputs would require four times the complexity and size. That would make it occupy even more space on the device 100.

Referring now to FIG. 3, the prefetched data is received by local sense amplifiers 110A LS/A 110H. The data is then advanced on the GIO lines 114A–114H, and then optionally passed through respective Input/Output Sense Amplifiers (I/OSA) 124A–124H, upon exiting MCA 102. The data is then advanced along respective individual operation blocks (also known as pipelines) 144A–144H, prior to reaching the data sequencing block 118. Accordingly, the data may be operated on as it is being advanced along pipelines 144A–144H.

In the large majority of cases, pipelines 144A–144H are identical to each other, as identical operations are performed for all read out data. Furthermore, sometimes it is advantageous that pipelines 144A–144H be decomposed into sequential stages. Each such stage is appropriately called a pipe, and performs only one of the operations.

Referring now to FIG. 4, a detail of pipeline 144A is shown. A more detailed explanation can be found in U.S. Pat. No. 5,802,596.

Pipeline 144A includes a first stage pipe 221, a second stage pipe 222 and a third stage pipe 223. The input signal enters the first stage pipe 221 and exits the third stage pipe 223. A first gate 231 is interposed between the first stage pipe 221 and the second stage pipe 222. A second gate 232 is interposed between the second stage pipe 222 and the third stage pipe 223. First gate 231 and second gate 232 are controlled by the clock signal through respective delay circuits 241, 242. As such, data is processed along pipeline 144 at the speed of the clock.

Referring now to FIG. 5, a circuit is shown for first gate 231. It will be observed that it receives a signal from previous stage 221, and outputs it to next stage 222. It operates from a latch signal Lt, of a clock.

BRIEF SUMMARY OF THE INVENTION

The present invention overcomes these problems and limitations of the prior art.

Generally, the present invention provides a memory device that is adapted for prefetching data, and a circuit and a method for reordering data within paths. The memory device of the invention has a memory cell array, with local sense amplifiers for receiving data bits prefetched from the memory cell array. The memory device of the invention also includes a serializer, and data paths that connect the local sense amplifiers to the serializer.

The invention additionally provides crossover connections interposed between stages of the data paths. These may transfer data bits from one of the data paths to another, before exiting the date path. Preferably they do that as part of being connecting switches between the stages. The stages are in turn controlled by an internal clock signal.

The invention offers the advantage that ordering is distributed within the data paths, and thus does not limit how fast the data rate may become. In addition, the space used remains at a fundamental minimum.

The invention will become more readily apparent from the following Detailed Description, which proceeds with reference to the drawings, in which:

BRIEF DESCRIPTION OF THE DRAWINGS

FIG. 12 is a table showing exemplary types of burst ordering.

DETAILED DESCRIPTION OF THE PREFERRED EMBODIMENT(S)

As has been mentioned, the present invention provides a memory device that is adapted for prefetching data. Embodiments of the invention are now described.

Figure 6:
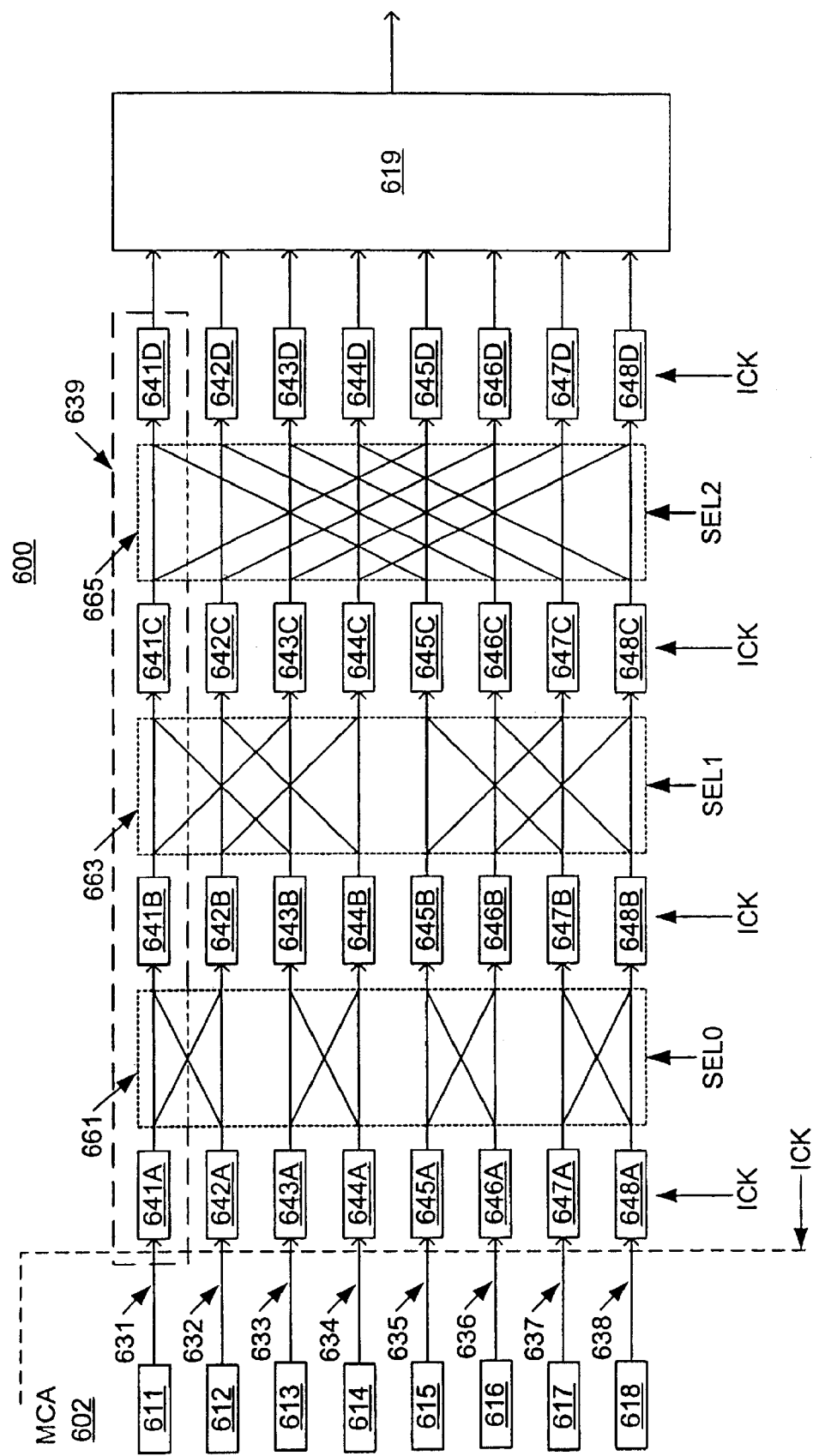
FIG. 6 is a diagram of a memory device made according to an embodiment of the present invention.

Referring to FIG. 6, a memory device 600 according to an embodiment of the invention includes a memory cell array 602 that has memory cells arranged at intersections of rows (often called word lines) and columns (also called bit lines).

Device 600 is drawn for an 8-bit case. This is by way of example, and not of limitation. The invention may be practiced with higher numbers of bits.

Device 600 also includes local sense amplifiers 611, 612, . . . , 618 for receiving data bits prefetched from the memory cell array. Prefetching and other memory operations are performed according to an internal clock signal ICK.

Device 600 additionally includes a serializer 619. Serializer 619 is used for serializing the data bits on local sense amplifiers 611, 612, . . . , 618.

Figure 1:
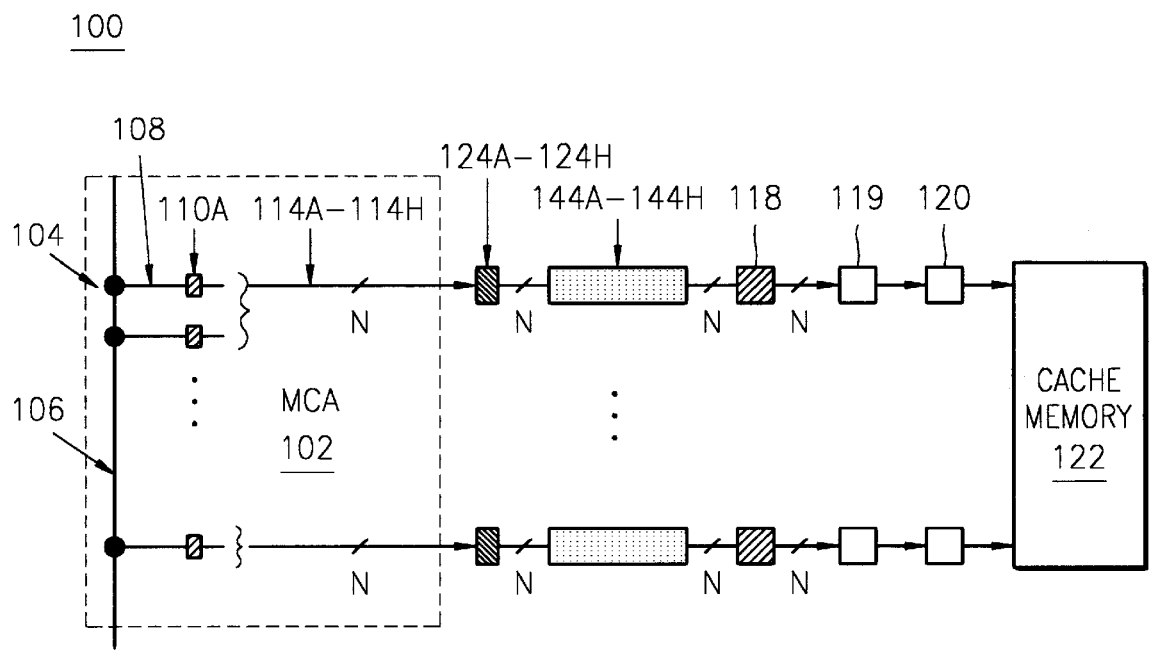
FIG. 1 is a diagram of salient components of a memory device in the prior art.
Figure 2:
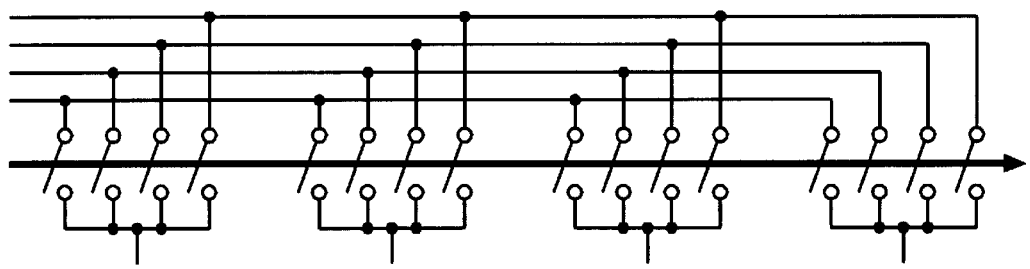
FIG. 2 is a diagram of a portion of a data sequencer block of the memory of FIG. 1.
Figure 3:
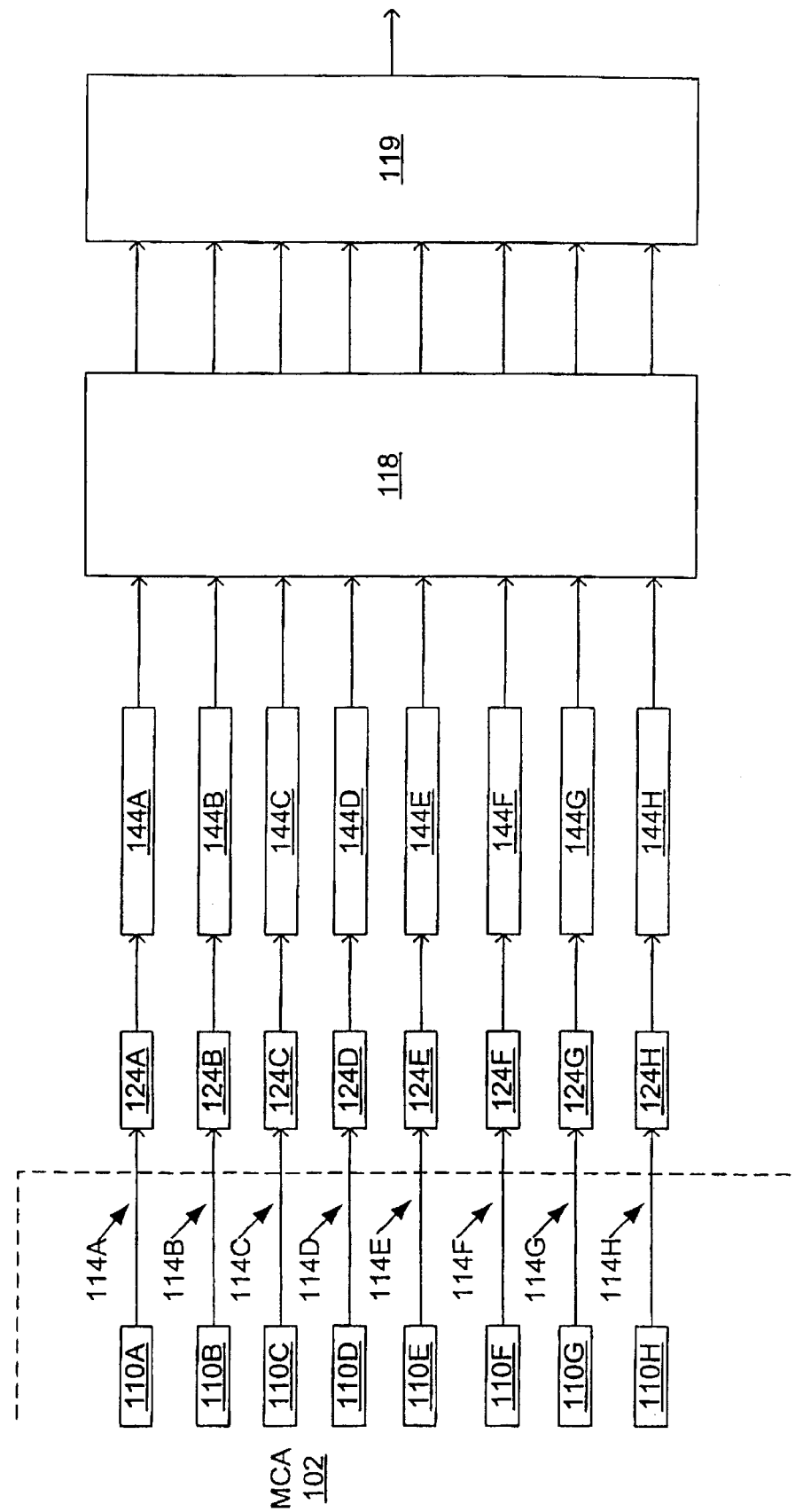
FIG. 3 is a block diagram of a prior art prefetched data paths implemented along a global input/output line of the memory device of FIG. 1.
Figure 4:
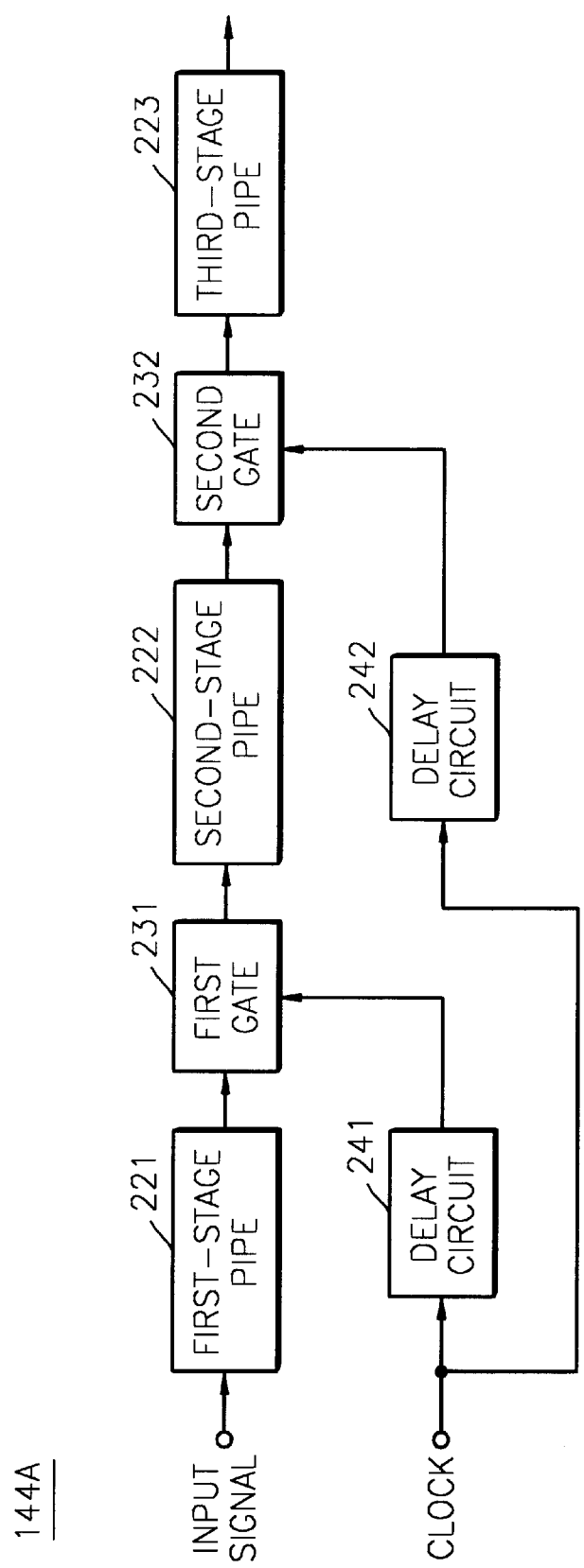
FIG. 4 is a block diagram of one of the multi-stage prefetched data paths of FIG. 3.
Figure 5:
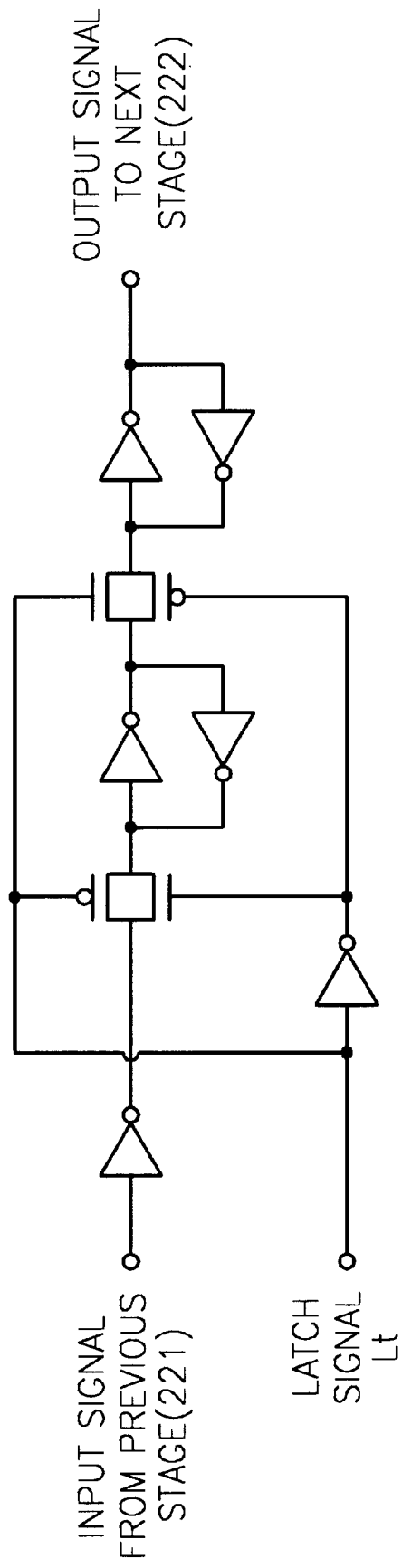
FIG. 5 is an electrical circuit diagram of a gate of one of the data paths of FIG. 4.

Device 600 moreover includes data paths 631, 632, . . . , 638. As an example, data path 631 is additionally shown within dashed rectangle 639. Data paths 631, 632, . . . , 638 are for guiding data bits from the respective local sense amplifiers 611, 612, . . . , 618 to the serializer 619. Data paths 631, 632, . . . , 638 may include global I/O lines of device 600. Each of the paths 631, 632, . . . , 638 includes stages 641A–641D, 642A–642D, . . . , 648A–648D. These stages, also called pipes, are for operating on the guided bits prior to them reaching serializer 619. One of the pipes may include an input/output sense amplifier. These pipes may include one of the gates shown in FIG. 4 even though four stages are shown, more or fewer are possible according to the invention, even just one.

Device 600 importantly also includes three sets of crossover connections 661, 663, 665. These are interposed between the stages 641A–641D, 642A–642D, . . . , 648A–648D of data paths 631, 632, . . . , 638 respectively.

Sets 661, 663, 665 include crossover connections within the data paths 631, 632, . . . , 638, between their respective stages. A crossover connection is for transferring a first bit from one of the stages of one of the data paths to a next stage of either the same data path or another data path. Transferring is performed responsive to ordering signals. The crossover connections are preferably such that all possible combinations of transferring may be implemented. This is accomplished by having the three sets 661, 663, 665 be different from each other. Indeed, set 661 is for transferring between adjacent data paths, while set 665 is for transferring to a data path four data paths away, thus skipping over three data paths.

Sets 661, 663, 665, respectively, receive ordering signals SEL0, SEL1, SEL2, based on which the transferring may or may not happen. Ordering signals SEL0, SEL1, SEL2 are also known as selections signals SEL0, SEL1, SEL2. The ordering signal may be made by combining an address, a sequential, and an interleave signal. Both the ordering signal and its complement may be used. Depending on the specific embodiment, each one of ordering signals SEL0, SEL1, SEL2 may include subsignals for individual ones of the crossover connections. A particular one of the crossover connections is described in more detail with reference to FIG. 9 below.

Continuing to refer to FIG. 6, one of the crossover connections of set 661 might transfer a first data bit from first stage 641A of data path 631 either to second stage 642B of data path 632, or to second stage of the same data path 631. In addition, a second data bit might be transferred from first stage 642A of data path 632 either to second stage 641B of data path 631, or to second stage of the same data path 632, responsive to SEL0. And then, one of the crossover connections of set 663 might transfer the data bit in the second stage of data path 631 either to third stage 643C of data path 633, or to third stage of the same data path 631. In addition, the data bit in the second stage of data path 632 might be transferred either to third stage 644C of data path 634, or to third stage 642C of the same data path 632, responsive to SEL1. And then, one of the crossover connections of set 663 might transfer the data bit in the third stage 641C of data path 631 either to a fourth stage 645D of data path 635, or to a fourth stage of the same data path 631. In addition, the data bit in the third stage 641C of data path 631 might be transferred either to fourth stage 645D of the data path 635, or to fourth stage of the same data path 631, responsive to SEL2. This way, if all three transfer occur, the subject data bit would be first output on local sense amplifier 611, and then would be operated on by stages 641A, 642B, 644C, 648D through a set of crossover connections 661, 663,665 successively, prior to being input in serializer 619.

In the preferred embodiment, sets 661, 663, 665 also operate as the gates between stages 641A–641D, 642A–642D, . . . , 648A–648D of data paths 631, 632, . . . 638, respectively.

In device 600, therefore, ordering of the data is distributed along the data paths. This takes advantage of the fact that the signal path has enough timing margin. This means that ordering the data does not penalize the device by imposing a limitation on how fast the system clock XCK can become. In addition, since ordering is distributed, the space required on device 600 remains at a fundamental minimum. Moreover, the invention may be scaled to a device with either fewer or more prefetched data bits, by including fewer or more connections, while preserving these advantages.

Figure 7:
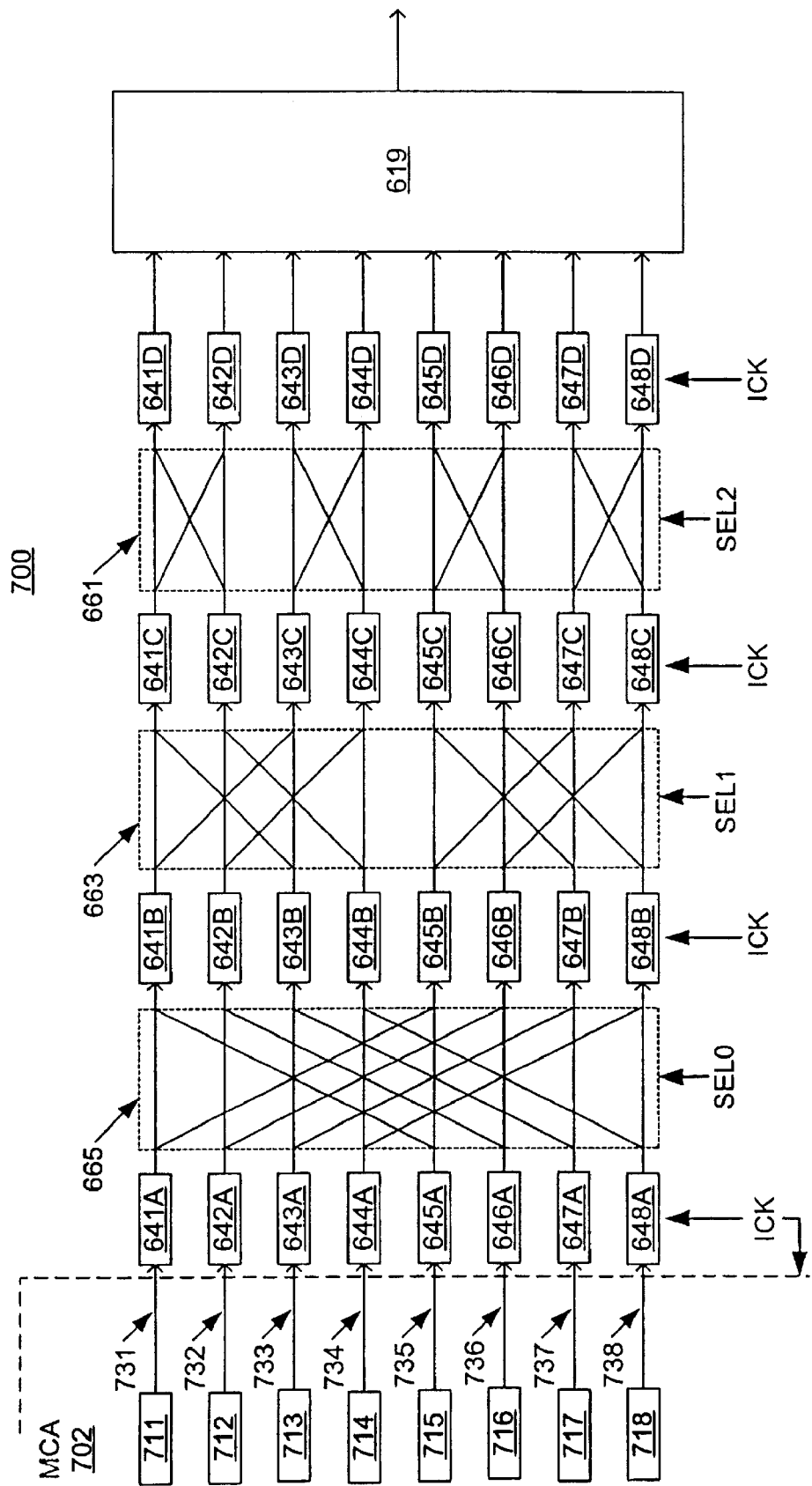
FIG. 7 is a diagram of a memory device made according to another embodiment of the present invention.

Referring now to FIG. 7, a device 700 according to another embodiment of the invention is described. It includes parts similar to those of device 600, whose description will therefore not be repeated.

Device 700 includes a memory cell array 702, which includes memory cells for storing data. The memory cells output prefetched data on local sense amplifiers 711, 712, . . . , 718. These in turn advance the data on respective data paths 731, 732, . . . 738.

Device 700 also includes the same three sets 661, 663, 665 of crossover connections as device 600 of FIG. 6. Importantly, these are arranged in a different order than those of device 600. More specifically set 661 is interchanged with set 665. This will necessitate a different scheme for the ordering signals SEL0, SEL1, SEL2, as will be readily understood by a person skilled in the art.

Figure 8:
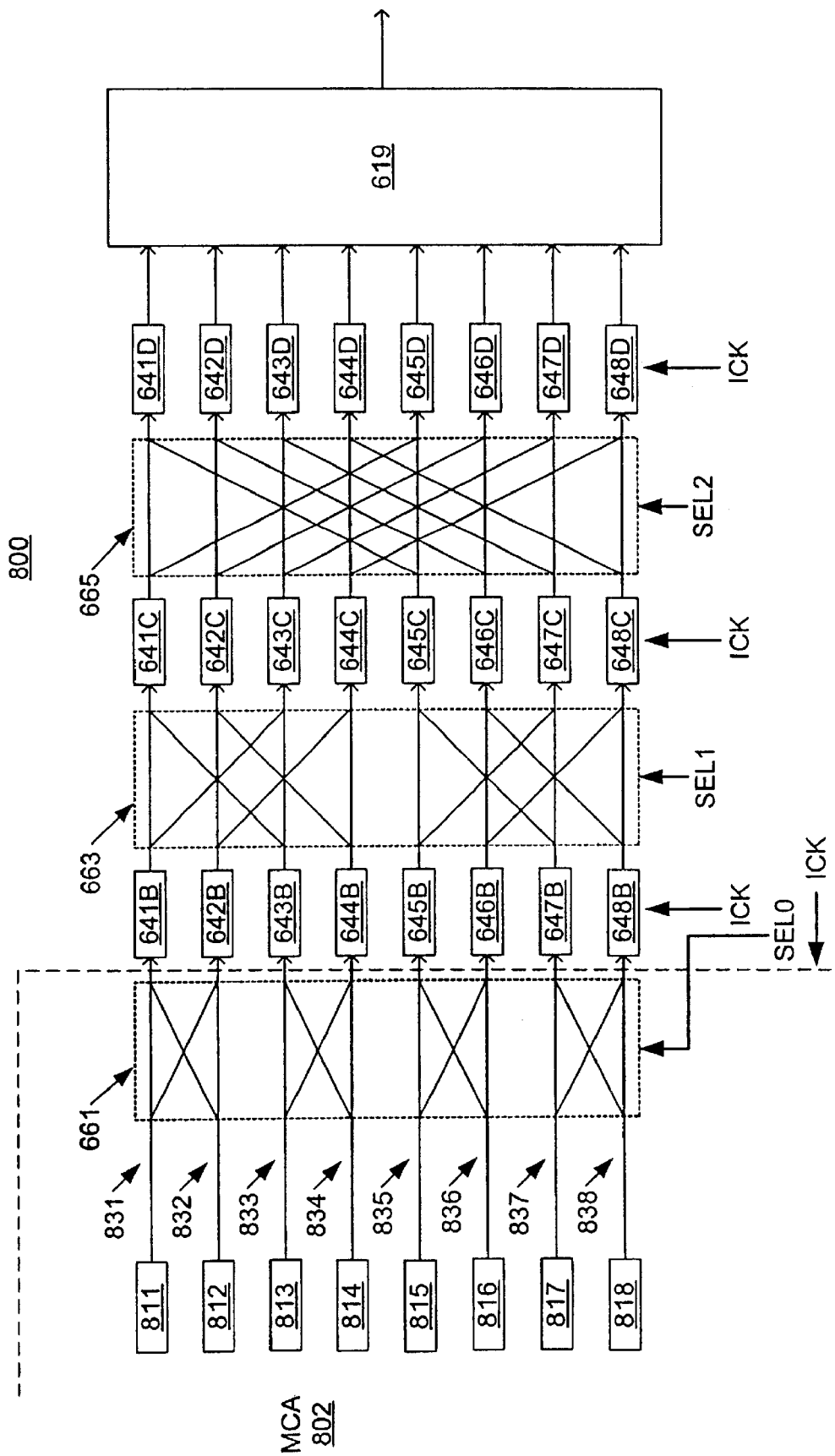
FIG. 8 is a diagram of a memory device made according to yet another embodiment of the present invention.

Referring now to FIG. 8, a device 800 is described, which is made according to yet another embodiment of the invention. It includes parts similar to those of device 600, whose description will therefore not be repeated.

Device 800 includes a memory cell array 802, which includes memory cells for storing data. The memory cells output prefetched data on local sense amplifiers 811, 812, . . . , 818. These in turn advance the data on respective data paths 831, 832, . . . , 838.

Device 800 also includes the same three sets 661, 663, 665 of crossover connections as device 600 of FIG. 6. Importantly, set 661 is provided within memory cell array 802. This means that the connections of set 661 are between local sense amplifiers 811, 812, . . . , 818 and the first stages of the respective data paths 631, 632, . . . , 638.

Figure 9:
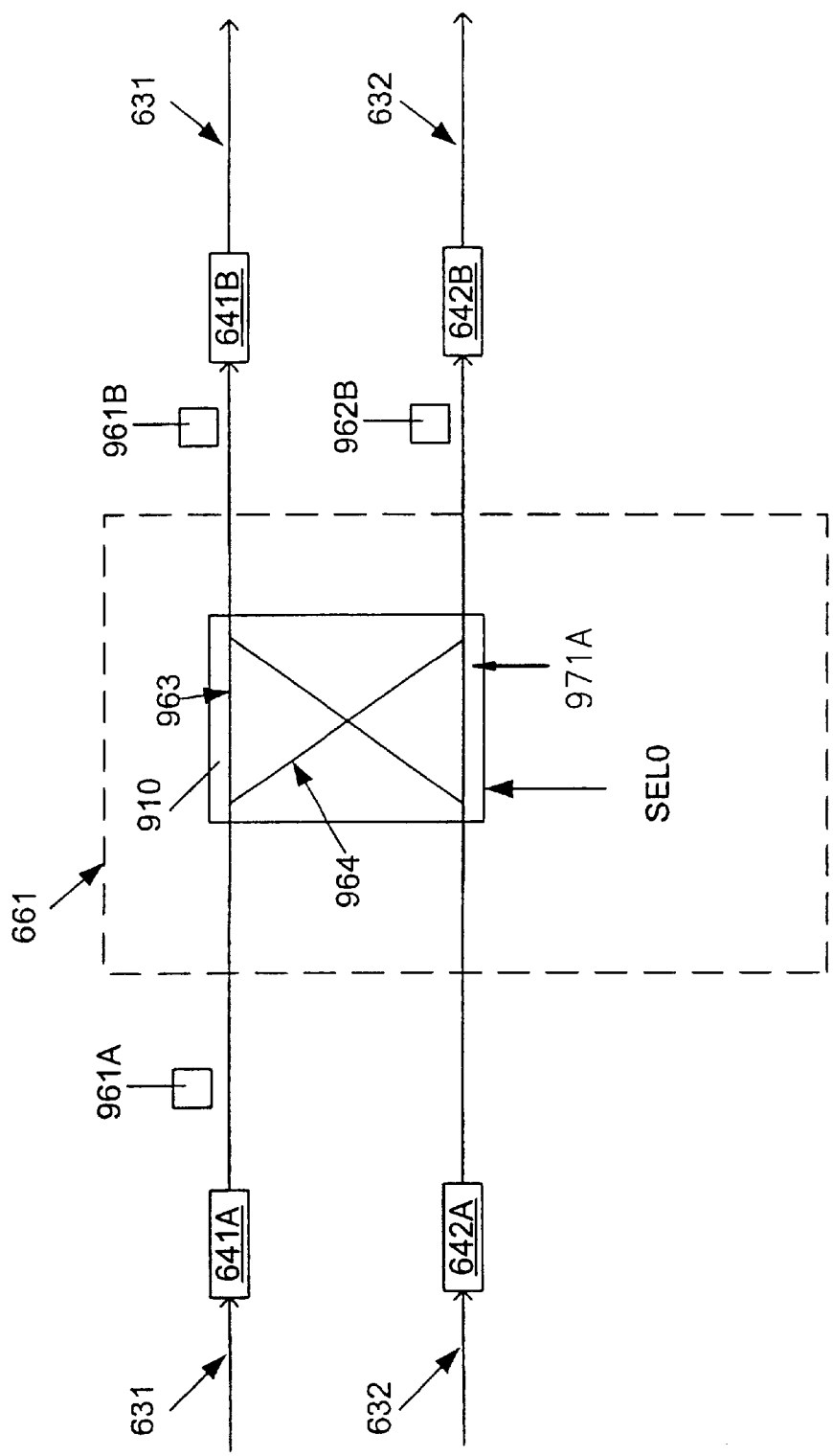
FIG. 9 is a block diagram of a combination of a stage with a crossover connection of a set of crossover connections of FIG. 6.

Referring now to FIG. 9, a crossover connection 910 is described. It will be appreciated that, while crossover connection 910 is the one that of those in set 661 of device 600 that is between neighboring data paths 631, 632, the present description can be generalized to all the crossover connections of the invention.

Crossover connection 910 has a continuing path 963 coupled to a next stage 641B of the same data path 631. Connection 910 can therefore guide a first bit 961A through continuing path 963 to next stage 641B.

Connection 910 also has a transfer path 964 coupled to a next stage 642B of another data path 632. Crossover connection 910 is for optionally transferring first bit 961A from data path 631 to data path 632 as transferred bit 962B.

First bit 961A is transferred to a first connection point 971A of data path 632. It will be appreciated that first connection point 971A is before stage 642B of data path 632, and thus prior to the transferred bit 962B reaching the serializer (not shown in FIG. 9).

Transferring may be implemented according to ordering signal SEL0. Alternately, if ordering signal SEL0 is of a different state, first bit 961A may stay in data path 631, emerging past crossover connection 910 as bit 961B.

It is highly preferred that crossover connection 910 is further adapted to reciprocally transfer a second bit from the second path to the first path. Such may happen responsive to the same ordering signal SEL0. In addition, crossover connection 910 may operate responsive to the internal clock signal ICK.

Figure 10:
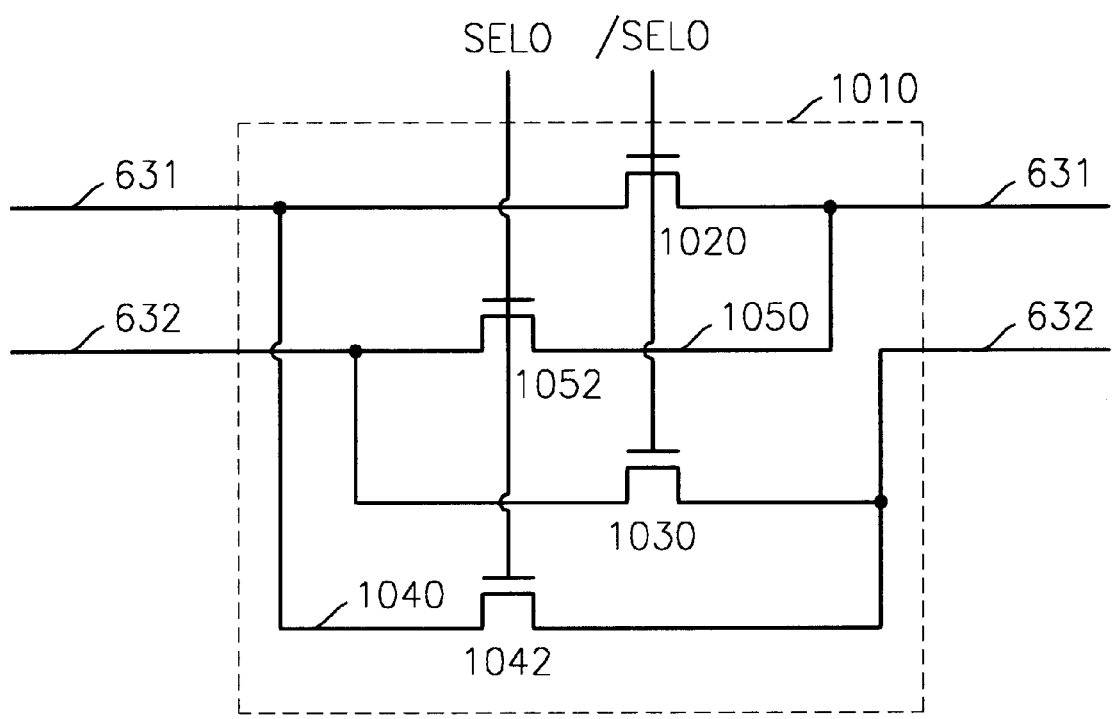
FIG. 10 illustrates an implementation of a crossover connection 910 of the diagram of FIG. 9 according to an embodiment of the invention.

Referring now to FIG. 10, a crossover circuit 1010 is illustrated for implementing of crossover connection 910 of FIG. 9 according to an embodiment of the invention. Crossover circuit 1010 is preferably implemented by a multiplexer.

The particular embodiment of crossover circuit 1010 includes a first main switch 1020 in first data path 631, and a second main switch 1030 in second data path 632. A first crossing conductor 1040 joins the first path 631 with the second path 632, having a first crossover switch 1042 between the paths. A second crossing conductor 1050 joins the second path 632 to the first path 631, having a second crossover switch 1052 between the paths.

In the embodiment of FIG. 10, the first crossover switch 1042 and the second crossover switch 1052 are controlled by selection signal SEL0. In addition, the first main switch 1020 and the second main switch 1030 are controlled by an inverse /SEL0 of the selection signal SEL0, which is also known as the complement of SEL0.

Figure 11:
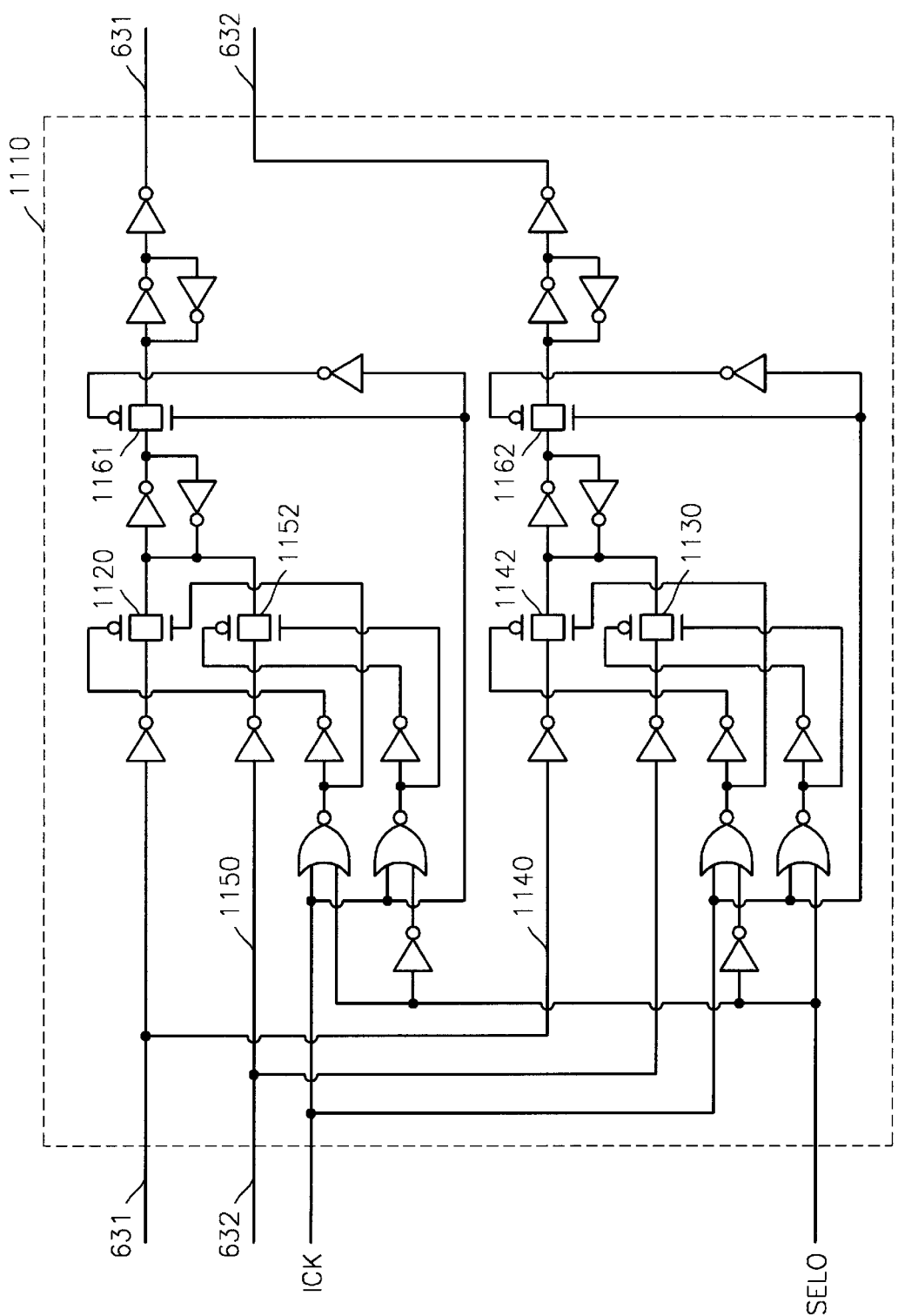
FIG. 11 illustrates an implementation of a crossover connection 910 of the diagram of FIG. 9 according to another embodiment of the invention.

Referring now to FIG. 11, a crossover circuit 1110 is illustrated for implementing one stage along with a crossover connection 910 of FIG. 9, according to an embodiment of the invention. The particular embodiment of crossover circuit 1110 includes a first main switch 1120 in first data path 631, and a second main switch 1130 in second data path 632 controlled by ordering signal SEL0 and internal clock ICK. First and second main switches 1120, 1130 may be implemented as connecting gates, although the invention is not limited in this regard.

A first crossing conductor 1140 joins the first path 631 with the second path 632, having a first crossover switch 1142 between the paths. A second crossing conductor 1150 joins the second path 632 to the first path 631, having a second crossover switch 1152 between the paths. First and second crossover switches 1142, 1152 may also be implemented as connecting gates, although the invention is not limited in this regard.

In the embodiment of FIG. 11, a first latch gate 1161 is interposed in the first path 631, and controlled by internal clock signal ICK. Similarly, a second latch gate 1162 is interposed in the second path 632, and controlled by internal clock signal ICK.

FIG. 12 is a table showing exemplary types of burst ordering, for an 8-bit burst. On the left hand columns are the control bits A2, A1, A0 of burst ordering control signal A[2:0]. On the right hand columns are shown the numbers of the bits for sequential type ordering, and interleave type ordering.

In this invention, ordering signals SEL0, SEL1, and SEL2 are generated by combining address, sequential, and interleave signals. All permutations for reordering data are possible by selecting proper ordering signals SEL0, SEL1, and SEL2.

Figure 13:
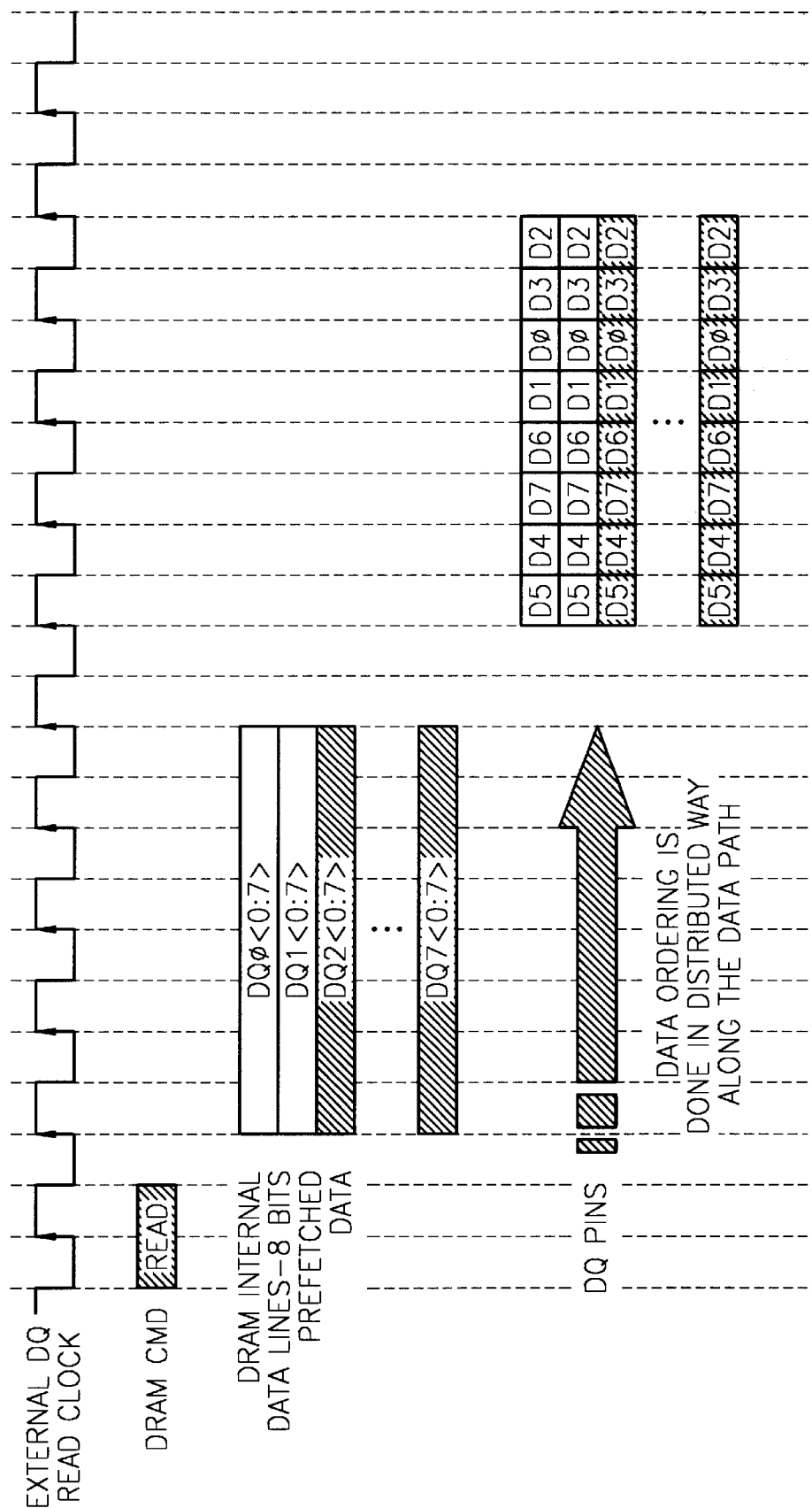
FIG. 13 is a timing diagram for an 8-bit burst interleave mode operation for a device according to an embodiment of the invention.

FIG. 13 is a timing diagram for an 8-bit burst interleave mode operation for a device according to an embodiment of the invention. More particularly, it is for an 8-bit prefetch case, during Double Data Read (DDR) operation, where burst ordering addresses A[2:0] are 101 and interleave type.

Figure 14:
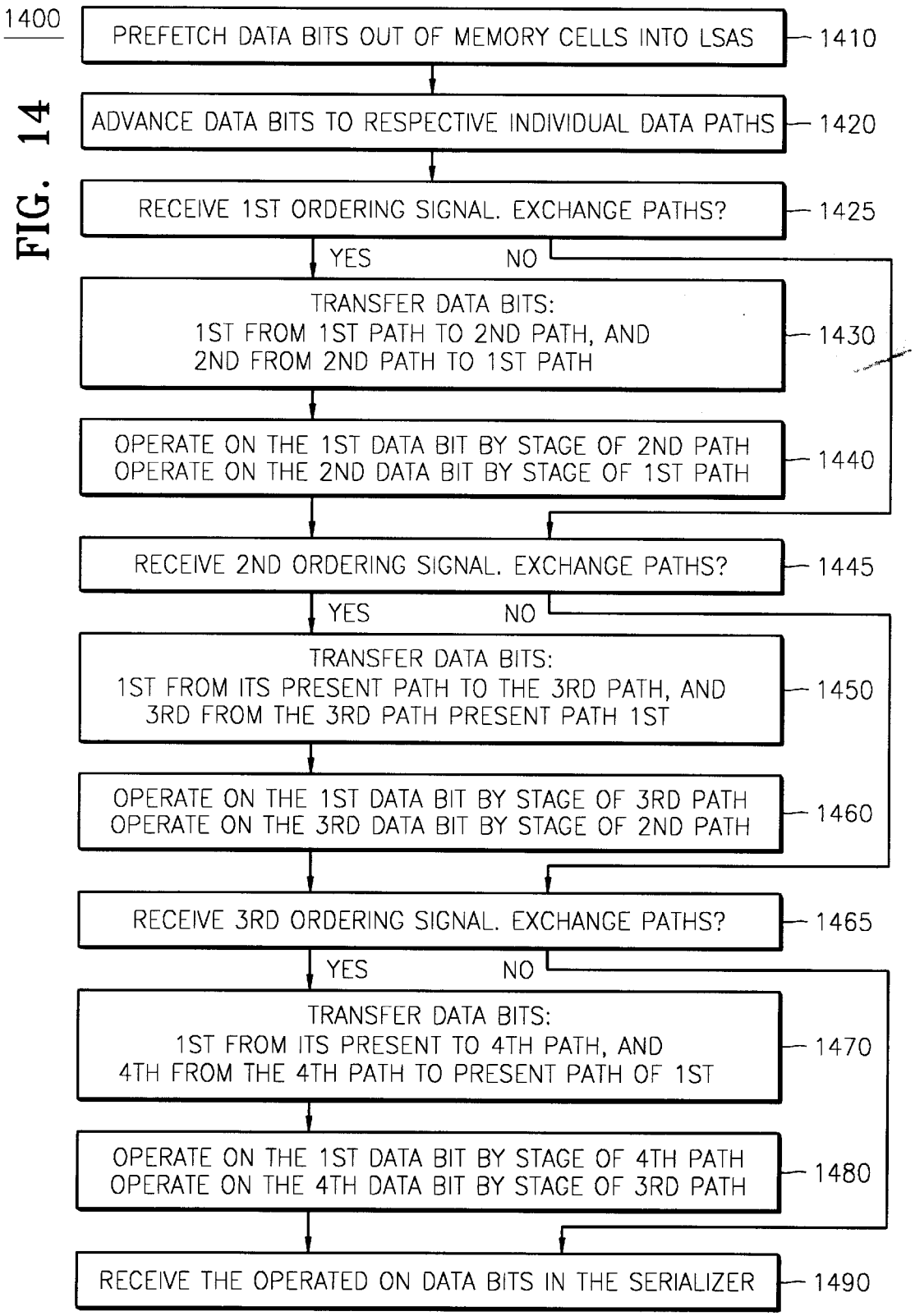
FIG. 14 is a flowchart illustrating a method according to an embodiment of the invention.

Referring now to FIG. 14, a flowchart 1400 is used to illustrate a method according to an embodiment of the invention. The method of flowchart 1400 may be used in conjunction with any of the devices of the invention. It will be recognized that any reordering scheme is possible.

According to a box 1410, data bits are prefetched out of memory cells into local sense amplifiers.

According to a next box 1420, the data bits are advanced from the local sense amplifiers into respective individual data paths that terminate in a serializer.

According to next box 1425, a first ordering signal is received. It is determined whether it is desired to change paths, depending on the first ordering signal. The process is also called data exchanging.

If not, execution proceeds to box 1445.

If yes, then according to a next box 1430, a first data bit is transferred from a first one of the paths to a second one of the paths. Optionally, a second data bit is concurrently transferred from the second path to the first path. Then according to a next box 1440, the first data bit is operated on by a stage of the second path. Preferably, the second data bit is concurrently operated on by an stage of the first path. Then execution proceeds to box 1445.

According to a next box 1445, a second ordering signal is received. It is determined whether it is desired to change paths, depending on the second ordering signal.

If not, execution proceeds to box 1465.

If yes, then according to a next box 1450, the first data bit is transferred from the second path to a third one of the paths. Optionally, a third data bit is concurrently transferred from the third path to the second path. According to a next box 1460, the first data bit is operated on by a stage of the third path. Preferably, the third data bit is concurrently operated on by a stage of the second path. Then execution proceeds to box 1445.

According to a next box 1465, a third ordering signal is received. It is determined whether it is desired to change paths, depending on the third ordering signal.

If not, execution proceeds to box 1490.

If yes, then according to a next box 1470, the first data bit is transferred from the third path to a fourth one of the paths. Optionally, a fourth data bit is concurrently transferred from the fourth path to the third path. According to a next box 1480, the first data bit is operated on by a stage of the fourth path. Preferably, the fourth data bit is concurrently operated on by an stage of the third path. Then execution proceeds to box 1490.

According to a next box 1490, the operated on data bits are received in the serializer. There they may be serialized.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and subcombinations of features, functions, elements and/or properties may be presented in this or a related document.

The invention claimed is:

1. A memory device comprising:

a memory cell array for storing data;

a plurality of local sense amplifiers for receiving data bits prefetched from the memory cell array;

a serializer; and a plurality of data paths for guiding the received data bits from respective ones of the local sense amplifiers to the serializer, each of the data paths having a plurality of stages arranged in sequential order prior to the serializer, wherein a certain stage has a continuing path coupled to a next stage of the same data path, and a transfer path coupled to a next stage of another data path, each of the plural sequentially ordered stages receiving a clock signal common thereto for sequentially selecting at the plural successive stages between the continuing and the transfer data paths.

2. The device of claim 1, further comprising:

guiding means for guiding a received data bit along one of the continuing path and the transfer path responsive to a selection signal.

3. The device of claim 2, wherein the guiding means is implemented by a 2:1 multiplexer.

4. The device of claim 3, wherein the first crossover connection includes:

a first main switch coupled to the first stage and the second stage in the first data path, a first crossover switch coupled to the first stage in the first data path and the second stage in the second data path, a second main switch coupled to the first stage and the second stage in the second data path, a second crossover switch coupled to the first stage in the second data path and the second stage in the first data path.

5. The device of claim 4, wherein the first and second main switches are controlled by the first ordering signal, and the first and second crossover switches are controlled by a complement of the first ordering signal.

6. A memory device comprising:

a memory cell array for storing data;

a plurality of local sense amplifiers in the memory cell array for receiving data bits prefetched from the memory cell array;

a serializer;

a plurality of data paths receiving prefetched data bits from one of the local sense amplifiers respectively, and outputting the prefetched data bits to the serializer, each data path having a plurality of stages; and sequentially arranged plural crossover connections between the local sense amplifiers and the serializer, the plural crossover connections receiving a common clock signal that determines the sequential timing of the plural crossover connections, wherein a first one of the crossover connections between a first stage in a first one of the data paths and a second stage in a second one of the data paths is adapted to transfer, responsive to a first ordering signal and the common clock signal, a first bit from the first stage in the first data path to one of a second stage in the first data path and to the second stage in the second data path, and a second bit from a first stage in the second data path to one of the second stage in the second data path and to the second stage in the first data path, and a second one of the crossover connections between the second stage of the first data path and a third stage in a third one of the data paths is adapted to transfer, responsive to a second ordering signal and the common clock signal, a data bit from the second stage in the first data path to one of a third stage in the first data path and to a third stage in the third data path.

7. The device of claim 6, wherein
at least one of the stages includes an input/output sense amplifier.

8. The device of claim 6, wherein
a third one of the crossover connections between the third stage of the first data path and a fourth stage in a fourth one of the data paths is adapted to transfer, responsive to a third ordering signal and the common clock signal, a data bit from the third stage in the first data path to one of a fourth stage in the first data path and to the fourth stage in the fourth data path.

9. The device of claim 8, wherein
the third crossover connection between the third stage of the second data path and a fourth stage in a sixth one of the data paths is adapted to transfer, responsive to the third ordering signal and the common clock signal, a data bit from the third stage of the second data path to one of a fourth stage in the second data path and to the fourth stage in the sixth data path.

10. The device of claim 8, wherein the third crossover connection includes:
a first main switch coupled to the third stage and the fourth stage in the first data path,
a first crossover switch coupled to the third stage in the first data path and the fourth stage in the fourth data path,
a second main switch coupled to the third stage and the fourth stage in the second data path,
a second crossover switch coupled to the third stage in the second data path and the fourth stage in the sixth data path.

11. The device of claim 10, wherein
the first and second main switches are controlled by the third ordering signal, and
the first and second crossover switches are controlled by a complement of the third ordering signal.

12. The device of claim 8, wherein:
the third ordering signal is generated from a combination of a third address, an interleave, and a sequential signal.

13. The device of claim 6, wherein
the second crossover connection between the second stage of the second data path and a third stage in a fifth one of the data paths is adapted to transfer, responsive to the second ordering signal and the common clock signal, a data bit from the second stage of the second data path to one of a third stage in the second data path and to a third stage in the fifth data path.

14. The device of claim 6, wherein the second crossover connection includes:
a first main switch coupled to the second stage and the third stage in the first data path,
a first crossover switch coupled to the second stage in the first data path and the third stage in the third data path,
a second main switch coupled to the second stage and the third stage in the second data path,
a second crossover switch coupled to the second stage in the second data path and the third stage in the fifth data path.

15. The device of claim 14, wherein
the first and second main switches are controlled by the second ordering signal, and
the first and second crossover switches are controlled by a complement of the second ordering signal.

16. The device of claim 6, wherein
the first ordering signal is generated from the combination of a first address, an interleave, and a sequential signal.

17. The device of claim 6, wherein
the second ordering signal is generated from a combination of a second address, an interleave, and a sequential signal.

18. The device of claim 6, wherein
the first crossover connection is located within the memory cell array.

19. The device of claim 6, wherein
the crossover connections are implemented by 2:1 multiplexers.

20. A data ordering method comprising:
prefetching a plurality of data bits from a memory array cell onto a plurality of local sense amplifiers;
receiving the data bits in a plurality of respective paths;
receiving a first ordering signal and a clock signal at a first crossover connection;
determining a first data exchanging in a first stage responsive to the first ordering signal, the first data exchanging being whether to transfer a first data bit from a first one of the paths to a second stage of a second one of the paths or to a second stage of the first data path, and a second data bit from the second path to the second stage of the first path or to the second stage of the second data path, said first data exchanging being synchronous with the clock signal;
receiving a second ordering signal and a clock signal at a second crossover connection;
determining a second data exchanging in the second stage responsive to the second ordering signal, the second data exchanging being whether to transfer the data bit transferred to the second stage in the first data path to a third stage of the first data path or to a third stage of a third one of the paths, and the data bit transferred to the second stage in the second data path to a third stage of the second path or to a third stage of a fourth one of the data path, said second data exchanging being synchronous with the clock signal but later in time than the first data exchanging; and
then receiving the data bits in a serializer.

21. The method of claim 20, further comprising:
receiving a third ordering signal and a clock signal at a third crossover connection; and
determining a third data exchanging in the third stage responsive to the third ordering signal, the third data exchanging being whether to transfer the data bit transferred to the third stage in the first data path to a fourth stage of the first data path or to a fifth one of the paths, and the data bit transferred to the third stage in the second data path to a fourth stage of the second data path or to a fourth stage of the sixth one of data paths, prior to receiving the data bits in the serializer.

22. The method of claim 20, wherein
the second data path is adjacent the first data path.

23. The method of claim 20, wherein
there are three data paths between the second data path and the first data path.

24. A method as in claim 20, 21, 22 or 23, wherein
the first stage operation is performed in an input/output sense amplifier.

25. A method as in claim 20, 21, 23 or 23, wherein
the first, second, and third ordering signal are made by combining an address, a sequential, and an interleave signal.

* * * * *

UNITED STATES PATENT AND TRADEMARK OFFICE
CERTIFICATE OF CORRECTION

PATENT NO. : 6,549,444 B2
DATED : April 15, 2003
INVENTOR(S) : Kyung et al.

It is certified that error appears in the above-identified patent and that said Letters Patent is hereby corrected as shown below:

<u>Column 10,</u>
Line 63, "as in claim 20, 21, 23 or 23," should read -- as in claim 20, 21, 22, or 23, --.

Signed and Sealed this

Eighteenth Day of May, 2004

JON W. DUDAS
*Acting Director of the United States Patent and Trademark Office*